(12) United States Patent
Tsuei et al.

(10) Patent No.: US 6,548,868 B1
(45) Date of Patent: Apr. 15, 2003

(54) ESD PROTECTION CLAMP WITH INTERNAL ZENER DIODE

(75) Inventors: David Tsuei, Sunnyvale, CA (US); Vladislav Vashchenko, Fremont, CA (US)

(73) Assignee: National Semiconductor Corp.

( * ) Notice: Subject to any disclaimer, the term of this patent is extended or adjusted under 35 U.S.C. 154(b) by 11 days.

(21) Appl. No.: 09/879,415

(22) Filed: Jun. 11, 2001

(51) Int. Cl.[7] ............................................... H01L 23/62
(52) U.S. Cl. ...................... 257/355; 257/603; 257/357
(58) Field of Search ................................ 438/197, 200, 438/201; 257/355, 356, 357, 603

(56) References Cited

U.S. PATENT DOCUMENTS

| | | | | |
|---|---|---|---|---|
| 5,416,351 A | * | 5/1995 | Ito et al. | 257/357 |
| 5,559,352 A | * | 9/1996 | Hsue et al. | 257/173 |
| 6,169,001 B1 | * | 1/2001 | Lin et al. | 438/294 |
| 6,171,891 B1 | * | 1/2001 | Lee et al. | 438/197 |
| 6,218,226 B1 | * | 4/2001 | Lin et al. | 438/200 |
| 2001/0006243 A1 | * | 7/2001 | Morishita | 257/360 |
| 2001/0036707 A1 | * | 11/2001 | Patelmo et al. | 438/380 |

* cited by examiner

*Primary Examiner*—Tuan H. Nguyen
(74) *Attorney, Agent, or Firm*—Jurgen Vollrath

(57) ABSTRACT

In a ESD protection clamp, breakdown and triggering voltage of the structure are reduced by introducing an internal zener diode structure that has a lower avalanche breakdown than the p-n junction of the ESD device. This introduces extra holes into the source junction region causing electrons to be injected into the junction and into the drain junction region to increase the carrier multiplication rate to increase the current density and lower the triggering voltage and breakdown voltage of devices such as NMOS devices or LVTSCRs.

17 Claims, 7 Drawing Sheets

ESD PROTECTION CLAMP WITH INTERNAL ZENER DIODE

FIELD OF THE INVENTION

The invention relates to an ESD protection structure having a reduced triggering voltage or reduced breakdown voltage.

BACKGROUND OF THE INVENTION

A common ESD protection solution is a snap back NMOS ESD protection clamp. Conventional snap back clamps make use of the snap back triggering characteristics of the parasitic bipolar structure to switch from some critical level of drain-source breakdown into high-conductivity due to avalanche injection.

A typical CMOS device is illustrated in FIG. 1 in which the polygate can be used as a self-aligned mask to produce a small drain-source spacing between the drain 14 and the source 16. The gate which is of the order of 0.18 $\mu$m in the case of 0.18 $\mu$m technology allows a drain-source spacing of the order of 0.1 $\mu$m to be achieved. A schematic representation of the structure of FIG. 1 is shown in FIG. 2 which defines the gap 12 in the p-well 18. The gap 12 extends between a lightly doped drain region 20 of the drain 14, and a lightly doped source region 22 of the source 16. As is shown in the electric field versus x-dimension graph in FIG. 2B, the electric field gradually increases from the source to the drain. Furthermore, the curves 24 become ever steeper as the voltage across the drain and source is increased. The effect of this is that hole concentration at the drain gradually increases with increasing electric field as shown in FIG. 2C. At the same time, the electron concentration at the source gradually increases. The breakdown voltage avalanche effect causes the holes to be swept across from the drain to the source and causes electron injection from the source to the drain. As can be seen in FIG. 2A, some of the holes are diverted into the gate 10 which is separated from the p-well only by a thin gate oxide 30. The gate coupling effect can be adjusted by adjusting the voltage on the gate thereby allowing the triggering voltage to be further reduced by limiting the number of holes that are diverted into the gate. The snap back triggering characteristic of the NMOS device of FIGS. 1 and 2, is used to switch the device into a high conductivity state with avalanche injection at some critical level of drain-source breakdown.

Unfortunately, due to parasitics in the circuit, especially PCB capacitance, triggering voltages are generally quite high, thus generating stress in the circuit due to the high currents that have to be handled by the circuit. A typical 0.18 $\mu$m, 3.3 V NMOS device will display triggering voltages of about 10V. As mentioned above, in the past the dynamic triggering voltage has been reduced by adjusting the voltage on the gate. However, this only approach only allows a triggering voltage reduction of about 20%.

The breakdown characteristics of the NMOS device described above are illustrated in FIG. 3 in which the drain current versus drain-source voltage characteristics are shown. As the drain-source voltage (Vds) increases, drain current (Id) remains substantially unchanged until the breakdown voltage (Vbr) 32 is reached. This causes rapid increase in Id. Eventually the hole concentration and electron concentration at the drain and source, respectively, is reversed, as defined by the triggering voltage (Vtr) 34. At this point, even with reduced Vds, the drain current continues to increase thus defining the snap back effect.

One of the challenges in designing a snap back NMOS clamp is achieving the requisite current handling capabilities. This can be solved through the use of dual gate oxide (DGO) NMOS devices. However this is achieved at the expense of even higher triggering voltages. The need to reduce the triggering voltage is based on the maximum allowable voltage that can be handled by the protected circuit during an electrostatic discharge, heat dissipation, hot carrier degradation, and gate oxide damage. Thus there is a need to reduce the triggering voltage of NMOS snap back clamps to enhance ESD protection clamp robustness.

Another common approach to the ESD problem is the use of LVTSCRs. These typically display even higher breakdown voltages than NMOS devices. Thus, it would be desirable to be able to reduce breakdown voltage levels in these devices as well, when used as ESD protection clamps.

SUMMARY OF THE INVENTION

Referring to the typical NMOS device shown in FIG. 1, the snap back triggering voltage of NMOS is determined by the drain-source breakdown voltage, which corresponds approximately to the breakdown voltage of the junction between the N+ drain 14 and the p-well 18. For purposes of ESD protection, a dual gate oxide (DGO) NMOS is commonly used. For a given process, the breakdown voltage is a fixed value that is usually higher than the breakdown voltage of minimum dimension single gate oxide devices that are to be protected by the clamp.

According to the invention, there is provided a snap back DGO NMOS ESD protection clamp comprising a NMOS structure having an internal zener diode structure having a breakdown voltage that is lower than the breakdown voltage of the drain-p-well junction of the NMOS structure.

Further, according to the invention it is provided a method of reducing the triggering voltage of a NMOS snap back clamp comprising forming a p-n junction to define a zener diode in the NMOS structure, having a breakdown voltage that is lower than the drain-p-well junction of the NMOS structure. Preferably the p-n junction is formed near the source-p-well junction, so that at least some of the holes generated due to avalanche breakdown of the zener diode drift towards the source to reduce the potential and cause electrons to be injected from the source-p-well junction. The injected electrons may further increase the carrier multiplication rate by drifting to the drain-p-well junction. Thus, by increasing the current density, snap back is reached sooner, to provide lower triggering and breakdown voltages.

The invention is however not limited to NMOS structures. More generally, according to the invention there is provided a method of reducing the breakdown voltage of an ESD protection device, comprising forming a zener diode in the ESD device, wherein the zener diode has a lower breakdown voltage than that of the ESD device. The ESD device can be a PMOS device or a LVTSCR structure. In the case of the LVTSCR, the zener diode is formed inside or adjacent to the floating drain of the LVTSCR.

Preferably, the region formed to define the zener diode, for instance, in the case of an NMOS device, a p+ region, is formed sufficiently closely to the source of the NMOS structure to inject electrons into the source junction during zener breakdown.

Still further, according to the invention, there is provided an ESD protection device, comprising at least one highly doped region adjacent or within a drain, floating drain or drain ballast region of the ESD protection device, having the opposite polarity to said drain, floating drain or drain ballast region, to form at least one p-n junction having a lower breakdown voltage than the breakdown voltage between said drain, floating drain, or drain ballast, and the substrate or well in which the drain, floating drain, or ballast is formed.

The highly doped region may be a single region extending substantially the entire length of the drain, floating drain, or drain ballast region, or can take the form of a plurality of islands in the drain, floating drain, or drain ballast region. In the case where the highly doped region takes the form of islands, these may extend all the way through the drain, floating drain, or drain ballast region. On the other hand, where the highly doped region extends substantially along the entire length of the drain, floating drain, or drain ballast region, it is typically formed above or below the drain or drain ballast region of the device so as not to interfere with the movement of charge carriers.

DETAILED DESCRIPTION OF THE INVENTION

Figure 1:
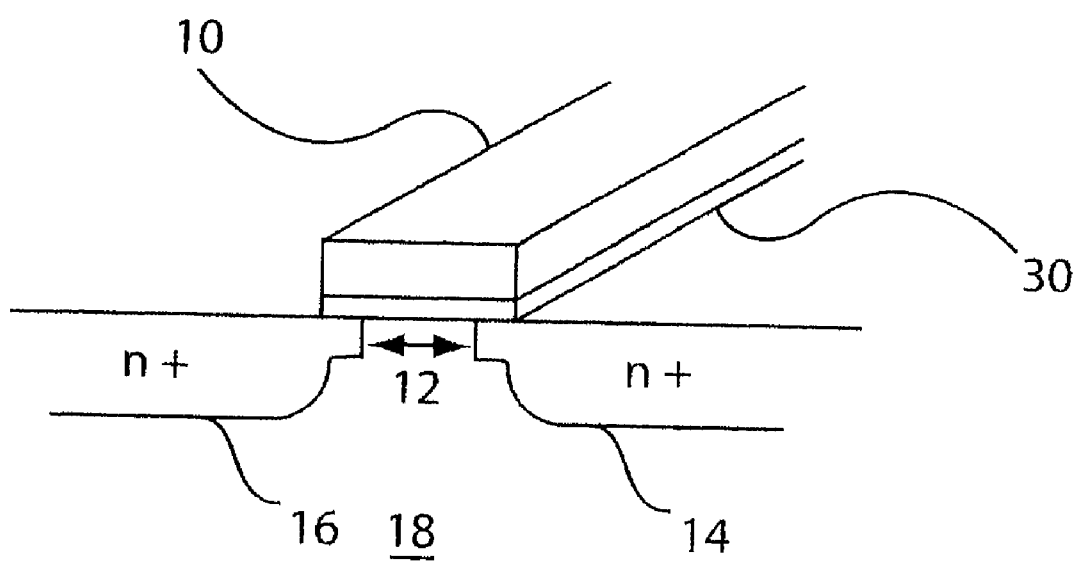
FIG. 1 is a three-dimensional representation of a conventional NMOS device.
Figure 2A:
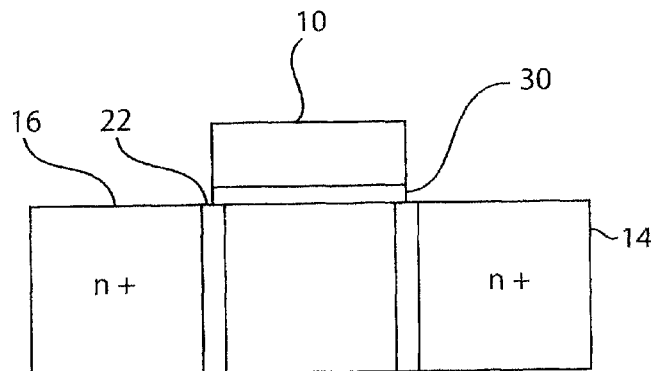
FIG. 2 is a schematic representation of the device of FIG. 1 with graphs showing electric fields and carrier distribution across the p-well of the device.
Figure 2B:
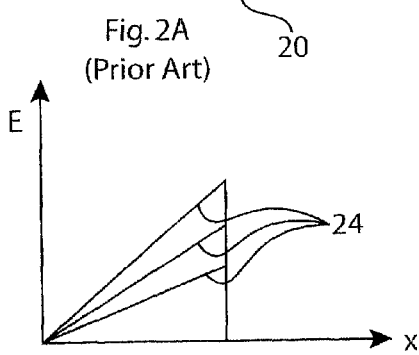
Figure 2C:
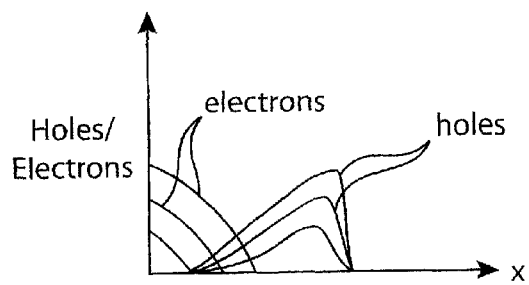
Figure 3:
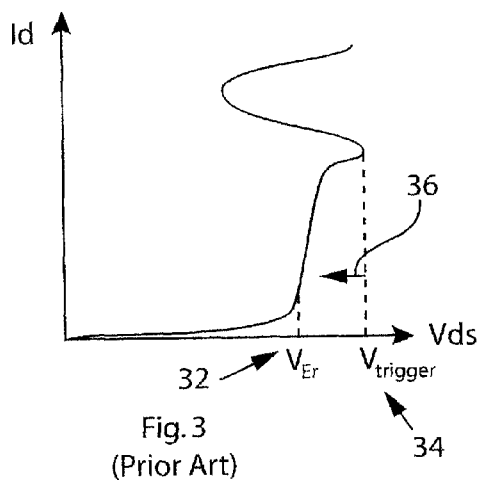
FIG. 3 is a drain current versus drain-source voltage curve of a typical NMOS device.
Figure 4:
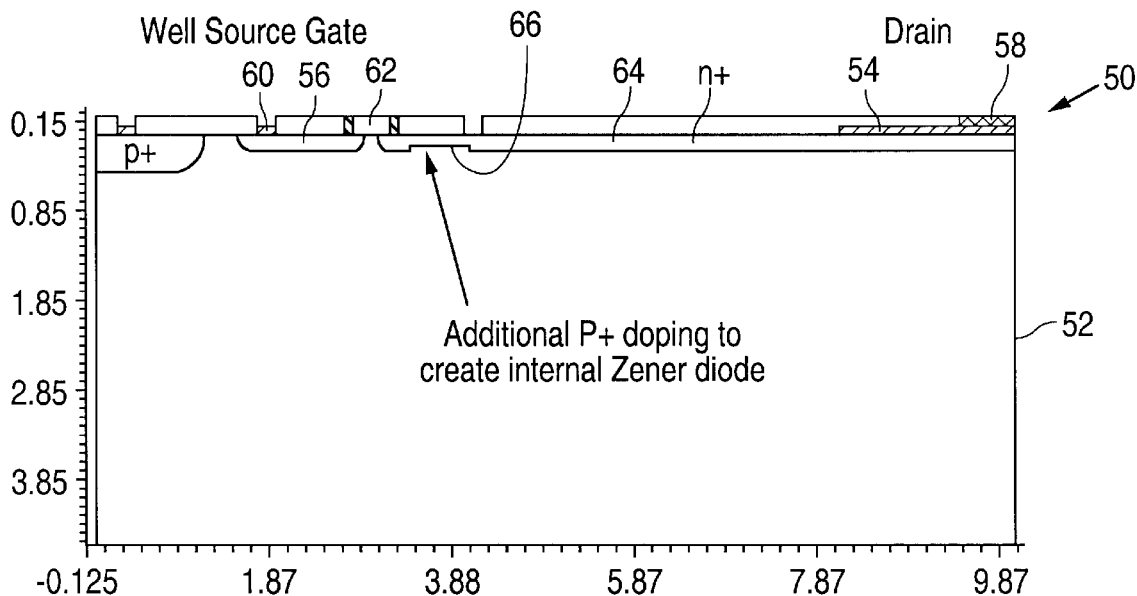
FIG. 4 is a sectional view of one embodiment of a modified dual gate NMOS structure of the invention.

FIG. 4 shows one embodiment of a modified dual gate NMOS device of the invention. The device 50 includes a p-well or substrate 52 in which a n+ drain 54 and n+ source 56 have been formed. FIG. 4 also shows the drain contact 58 and source contact 60. A gate 62 extends between a ballast region 64 and source 56. The ballast is a n+ composite non-silicided region that acts as a saturation resistor to limit current after triggering. In this embodiment, a highly doped p+ region 66 is formed along the length of the drain 54 near the gate 62. This is achieved by masking and implanting a p+ rich impurity such as boron into the p-well 52. This can be done when doping the p-well or substrate 52, in embodiments where the p+ region 66 extends below the n+ ballast region 64. The p+ region 66 can, instead, be formed as a separate implant step just before or after the n+ ballast region 64 is formed. By forming the highly doped p+ region 66, a p-n junction is formed having a lower breakdown voltage than the n+ drain—p+ well junction breakdown of a conventional NMOS device. Thus an internal, matched zener diode structure is created which acts as an ignition to initiate avalanche injection in the drain-source region.

Figure 5:
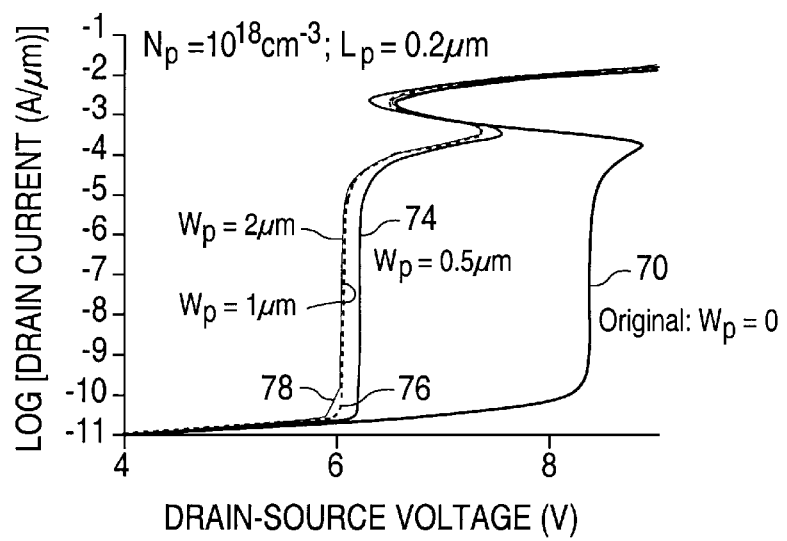
FIG. 5 shows current-voltage curves of the FIG. 4 embodiment for different p+ region widths.

The effect on breakdown voltage and triggering voltage is shown in FIG. 5 which shows the effect of various length p+ regions 66 (as measured perpendicularly to the cross-section shown in FIG. 4) compared to the prior art curve 70. For a p+ region length of 0.5 $\mu$m, the curve 74 shows a breakdown voltage of approximately 6.3 V and a triggering voltage of approximately 7.5 V. As the length of the p+ region is increased to 1 $\mu$m, as shown by the curve 76, the breakdown voltage decreases to just above 6 V, with a corresponding decrease in the triggering voltage. At a p+ region length of 2 $\mu$m (curve 78), the breakdown voltage decreases to just below 6 V.

Figure 6:
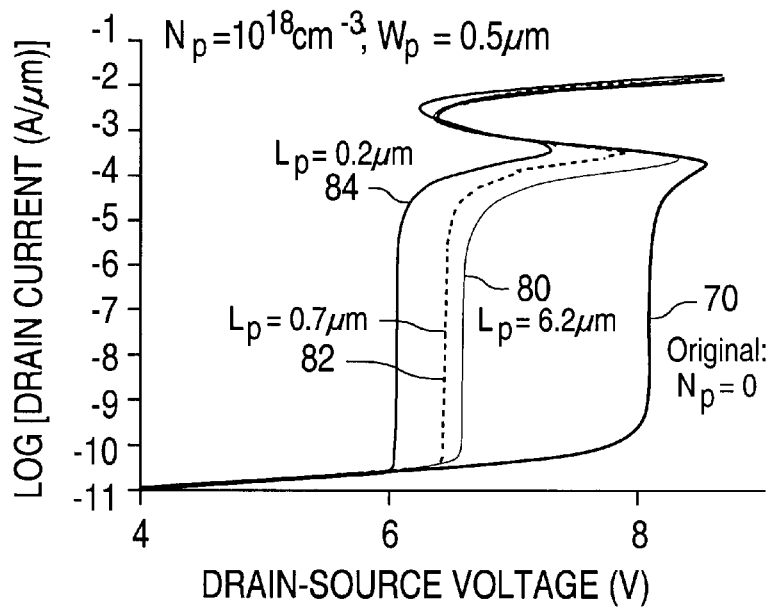
FIG. 6 shows log current-voltage curves for the FIG. 4 embodiment for different distances between the p+ region and the gate.

The distance between the p+ region 66 and the gate 62 was also shown to effect breakdown and triggering voltages as shown in FIG. 6. Again, the prior art curve is shown by the curve indicated by reference numeral 70. As the distance between the p+ region 66 and the gate 62 was reduced, the breakdown and triggering voltages were shown also to decrease. The curves 80, 82, 84 show the effects of reducing the distances between the p+ region 66 and the gate 62 from 6.2 $\mu$m, to 0.7 $\mu$m, to 0.2 $\mu$m, respectively.

Figure 7:
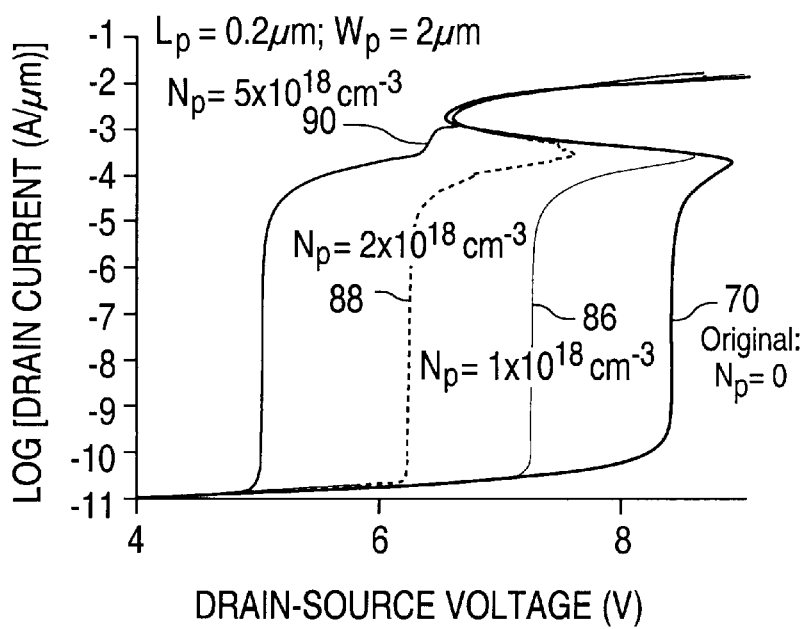
FIG. 7 shows log current-voltage curves for the FIG. 4 embodiment for different doping levels of the p+ region.

Increased doping levels for the p+ region 66 were also shown to have an effect on decreasing the breakdown and triggering voltage levels, as is evidenced by the curves of FIG. 7. Again, the prior art curve is indicated by reference numeral 70. Curve 86 shows the breakdown and triggering voltage levels at a doping level of $1\times10^{18}$ cm$^{-3}$. Curve 88 shows the effect on triggering and breakdown voltage at a doping level of $2\times10^{18}$ cm$^{-3}$ curve 90 shows the effect at doping level of $5\times10^{18}$ cm$^{-3}$. Thus the breakdown voltage decreases dramatically with increased doping levels of the p+ region. The effect of the p-n junction of the zener diode with its low breakdown voltage is to produce non-equilibrium carriers near the drain-source conductivity modulation region. The zener diode thus acts as an ignition to initiate avalanche injection. The holes generated due to avalanche breakdown of the zener diode junction will partially be diverted to the substrate 52 but will also drift towards the source junction, thereby reducing the potential and resulting in electrons being injected from the source junction. As explained above, the electrons drift into the drain junction to increase the carrier multiplication rate. The effect of this positive feedback is that the critical current for snap back is reached at a lower voltage to provide for a lower triggering voltage.

Figure 8:
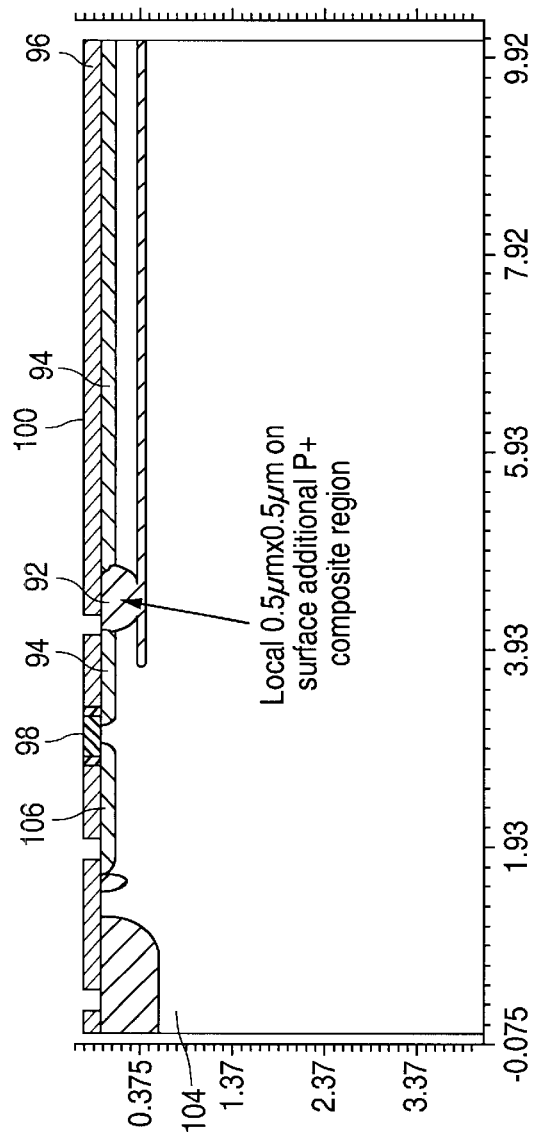
FIG. 8 is a sectional view of another embodiment of a modified dual gate NMOS structure of the invention.
Figure 9:
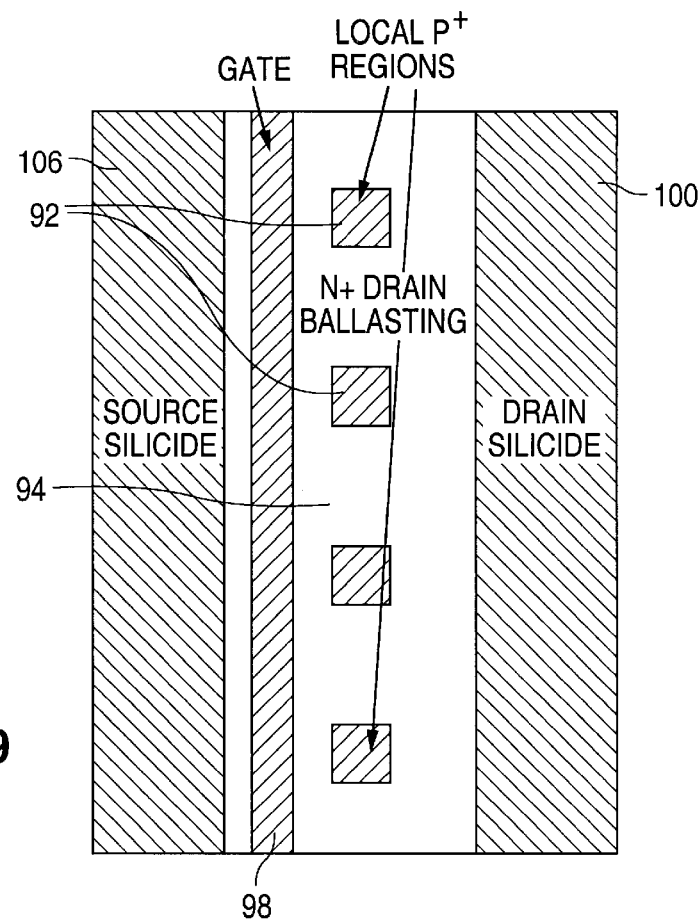
FIG. 9 is a plan view of the device of FIG. 8.

Another embodiment of the invention is illustrated in FIG. 8, in which the p+ highly doped region 92 takes the form of local p+ regions. The local islands of floating p+ regions again form low voltage zener diodes. However, in this embodiment the current path established by the n+ composite or ballast 94 extending between the drain region 96 and the gate 98 appears to be interrupted by the p+ regions which extend all the way to the drain silicide 100. A plan view, as shown in FIG. 9 however shows the localized nature of the p+ islands 92 which leave current paths in the n+ drain ballast 94. The rest of the structure remains the same, and includes a substrate or well 104, a source 106, and source silicide 108. This embodiment can be formed by using a blocking mask for the n+ composite 94, when creating the local p+ regions 90. In the case where the depths of the p+ implant regions 90 are deeper than the n+ drain ballast 94, the internal zener structure can be formed by using a single mask and doping the p+ region directly through the n+ drain ballast 94.

Figure 10:
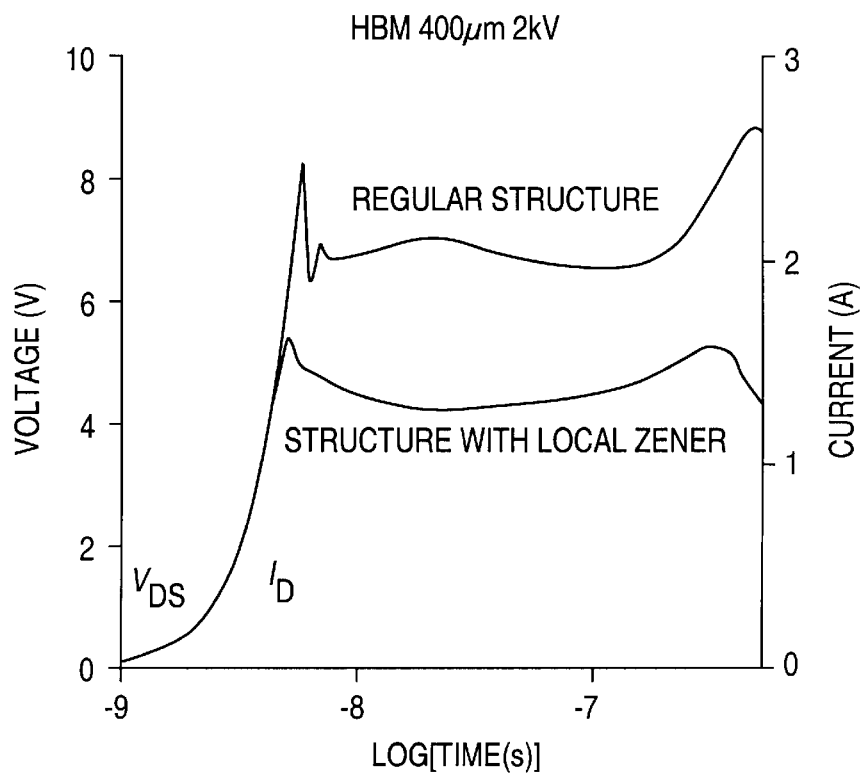
FIG. 10 shows voltage and current curves for an embodiment of the invention compared to the curves of a prior art NMOS device.

Again, as shown in FIG. 10 the breakdown and triggering voltages that are achieved using the internal zener diode structure of the invention, are much improved over the conventional NMOS structure.

Figure 11:
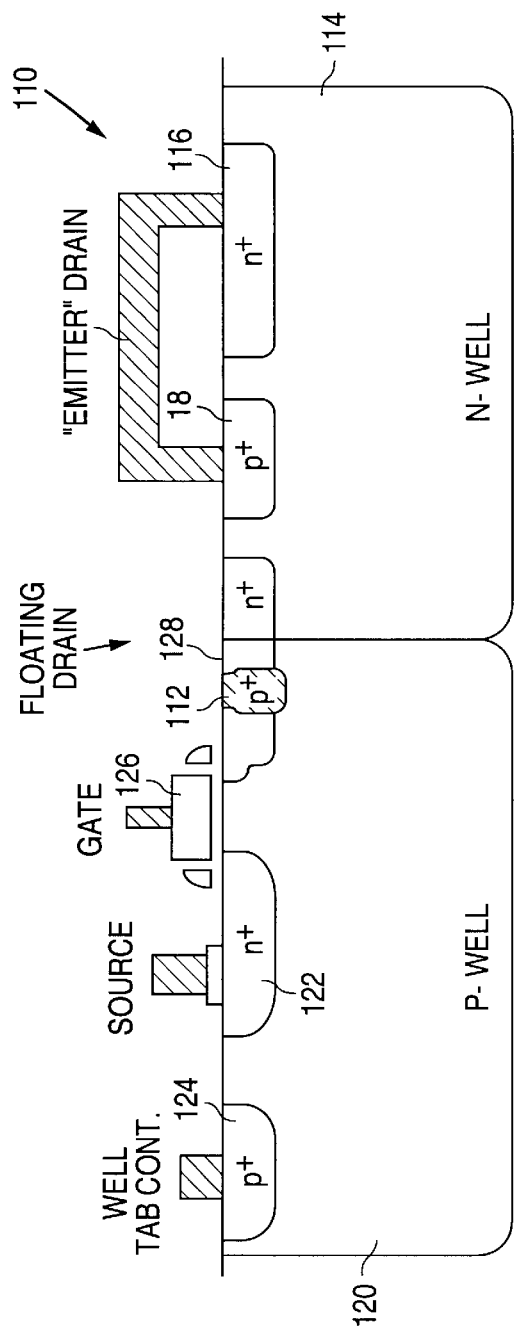
FIG. 11 is a sectional side view of one embodiment of an LVTSCR device in accordance with the invention.
Figure 12:
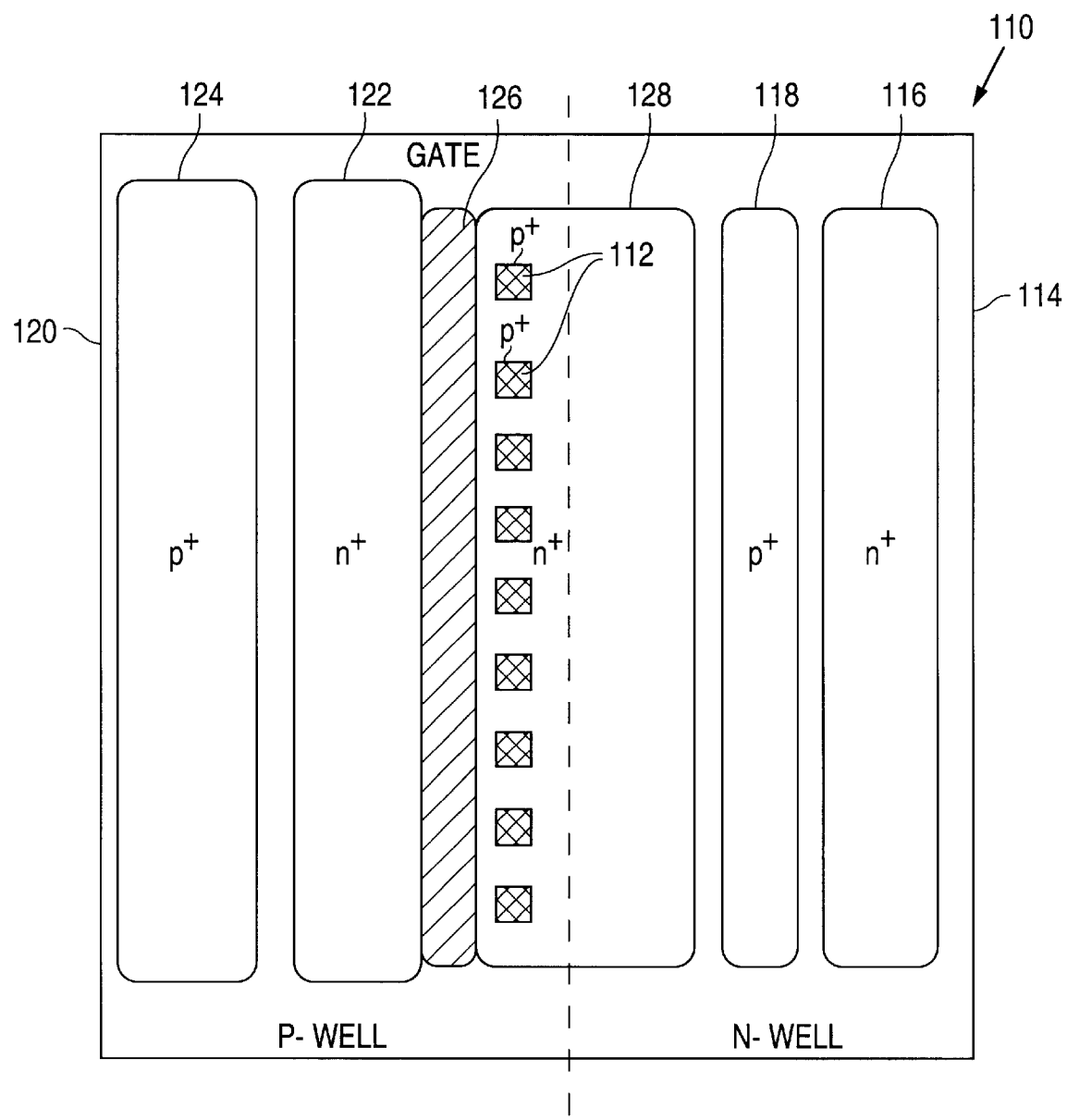
FIG. 12 is a plan view of the device of FIG. 11.

It will be appreciated that other configurations can be devised for the zener diode structure without departing from the teachings of the invention. For example, a low voltage silicon control rectifier (LVTSCR) structure, which typically has higher breakdown voltage levels than an NMOS structure, can have its breakdown voltage adjusted by adopting the approach of the invention. As illustrated in FIGS. 11 and 12, a LVTSCR structure 110 is used, into which p+ islands 112 have been implanted. The structure 110 includes an n-well 114, with n+ region 116 and p+ region 118 connected to form the drain. A p-well 120 includes a n+ source 122, a p+ region 124, a gate 126. A floating drain 128 extends between the n-well 114 and the p-well 120. By implanting p+ islands 112 into this floating drain, charge injection is achieved due to earlier breakdown of the zener diode defined by the p-n junctions between the floating diode 128 and p+ islands 112. It will be appreciated that an embodiment such as that of FIG. 4 could, instead, be used, rather than having discrete p+ islands that extend from the surface all the way through the floating drain 128.

It will be appreciated that other structures such as a PMOS device with implanted n+ region in a p+ drain, and other p-n junction configurations can be defined without departing from the scope of the invention.

What is claimed is:

1. A snap back DGO NMOS ESD protection clamp comprising
    a NMOS structure, and
    at least one internal zener diode structure formed in a ballast region of the NMOS structure, wherein the zener diode has a breakdown voltage that is lower than the breakdown voltage of the drain-p-well junction of the NMOS structure.

2. A method of reducing the triggering voltage of a NMOS snap back clamp comprising
    forming at least one p-n junction in a ballast region of the NMOS structure to define a zener diode in the NMOS structure, wherein the zener diode has a breakdown voltage that is lower than the breakdown voltage of the drain-p-well junction of the NMOS structure.

3. A method of claim 2, wherein the p-n junction is formed sufficiently near the source-p-well junction, so that at least some of the holes generated due to avalanche breakdown of the zener diode drift towards the source.

4. A method of reducing the breakdown voltage of an ESD protection device, comprising
    forming at least one zener diode in the ESD device, without contacts, wherein the zener diode has a lower breakdown voltage than that of the ESD device.

5. A method of claim 4, wherein the ESD device is an NMOS structure and the zener diode is formed by forming at least one p+ region in the n+ material of the drain or drain ballast region of the NMOS structure.

6. A method of claim 5, wherein the p+ region is formed sufficiently closely to the source of the NMOS structure to inject electrons into the source junction during zener breakdown.

7. A method of claim 4, wherein the ESD device is a LVTSCR structure and the zener diode is formed by forming at least one p+ region in a n+ floating drain of the LVTSCR structure.

8. A method of claim 4, wherein the ESD device is a PMOS structure and the zener diode is formed by forming at least one n+ region in the p+ material of the drain or drain ballast region of the PMOS structure.

9. An ESD protection device, comprising
    at least one doped region laterally adjacent or within a drain, floating drain or drain ballast region of the ESD protection device, having the opposite polarity to said drain, floating drain or drain ballast region, to form at least one p-n junction having a lower breakdown voltage than the breakdown voltage between said drain, floating drain, or drain ballast, and the substrate or well in which the drain, floating drain, or ballast is formed, wherein said doped region is not provided with a contact.

10. A device of claim 9, wherein the at least one highly doped region is a single region extending substantially the entire length of the drain, floating drain, or drain ballast region.

11. A device of claim 10, wherein the region extends into the drain, floating drain, or drain ballast region, but not all the way through the drain, floating drain, or drain ballast region.

12. A device of claim 9, wherein the at least one highly doped region consists of a plurality of islands extending into the drain, floating drain, or drain ballast region.

13. A device of claim 12, wherein the islands extend all the way through the depth of the drain, floating drain, or drain ballast region.

14. A device of claim 9, wherein the device is an NMOS device and the highly doped region is a p+ region formed inside or adjacent the drain or drain ballast region of the device.

15. A device of claim 9, wherein the device is a LVTSCR and the highly doped region is a p+ region formed in the n+ floating drain of the device.

16. A method of forming a zener diode structure in a ballast region of a NMOS structure, comprising
    using a blocking mask to define an undoped region during formation of the ballast region, and
    doping the undoped region with opposite polarity to the ballast region, during formation of other regions of said opposite polarity.

17. A clamp of claim 1, wherein none of the zener diode structures is provided with contacts.

* * * * *